(12) United States Patent
Lim et al.

(10) Patent No.: US 9,588,386 B2
(45) Date of Patent: Mar. 7, 2017

(54) Z-INVERSION TYPE DISPLAY DEVICE WITH 'T'-SHAPED ELECTRODE AND METHOD OF MANUFACTURING THE SAME

(71) Applicant: LG Display Co., Ltd., Seoul (KR)

(72) Inventors: Donggeun Lim, Namwon-si (KR); KiTaeg Shin, Daegu (KR); ChelHee Jo, Daejeon (KR); Jiwon Kang, Gyeryong-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/699,531

(22) Filed: Apr. 29, 2015

(65) Prior Publication Data
US 2015/0316825 A1 Nov. 5, 2015

(30) Foreign Application Priority Data
Apr. 30, 2014 (KR) .................. 10-2014-0052330

(51) Int. Cl.
*G02F 1/1362* (2006.01)
*H01L 27/12* (2006.01)
*G02F 1/1368* (2006.01)

(52) U.S. Cl.
CPC ...... *G02F 1/136227* (2013.01); *G02F 1/1368* (2013.01); *G02F 1/136286* (2013.01); *H01L 27/124* (2013.01); *H01L 27/1262* (2013.01)

(58) Field of Classification Search
None
See application file for complete search history.

(56) References Cited

U.S. PATENT DOCUMENTS

| 5,877,512 A | 3/1999 | Kim |
| 6,509,946 B1* | 1/2003 | Kodate ............... G02F 1/1368 349/141 |
| 6,906,385 B2* | 6/2005 | Moon ............... H01L 29/41733 257/347 |
| 7,842,951 B2* | 11/2010 | Park ............... H01L 27/12 257/128 |
| 2003/0117542 A1* | 6/2003 | Choo ............... G02F 1/1368 349/43 |
| 2004/0104388 A1 | 6/2004 | Hung |
| 2010/0141861 A1* | 6/2010 | Wang ............... G02F 1/1343 349/54 |
| 2012/0001189 A1* | 1/2012 | Matsubara ....... G02F 1/136286 257/59 |

FOREIGN PATENT DOCUMENTS

| EP | 0 654 828 A2 | 5/1995 |
| KR | 10-2001-0105923 A | 11/2001 |
| KR | 10-2003-0053241 | 6/2003 |
| KR | 10-2009-0013531 | 2/2009 |
| KR | 10-2013-0016922 A | 2/2013 |

* cited by examiner

*Primary Examiner* — Bilkis Jahan
(74) *Attorney, Agent, or Firm* — Fenwick & West LLP

(57) ABSTRACT

The present invention provides a Z-inversion type display device comprising a gate line and a data line that intersect with each other to define a pixel area on a substrate, a thin film transistor that includes a gate electrode, a semiconductor layer, a source electrode and a drain electrode, and a pixel electrode that is formed in the pixel area, and is electrically connected to the drain electrode of the thin film transistor, wherein the drain electrode completely overlaps the gate line such that a drain electrode area is wholly included in a gate line area on a plan view.

15 Claims, 15 Drawing Sheets

Z-INVERSION TYPE DISPLAY DEVICE WITH 'T'-SHAPED ELECTRODE AND METHOD OF MANUFACTURING THE SAME

CROSS-REFERENCE TO RELATED APPLICATION

This application claims priority under 35 U.S.C. 119(a) to Republic of Korea patent application no. 10-2014-0052330 filed on Apr. 30, 2014, which is incorporated by reference herein in its entirety.

BACKGROUND OF THE INVENTION

1. Field of the Invention

The present invention is a technology related to a display device and a method of manufacturing the display device. Specially, the present invention is a technology related to a display device in which pixels are formed in a Z-inversion type, and a method of manufacturing the display device.

2. Description of the Prior Art

With the development of the information society, various types of requirements for a display device for displaying an image are increasing and, recently, various display devices, such as a Liquid Crystal Display (LCD), a Plasma Display Panel (PDP), and an Organic Light Emitting Diode Display Device (OLED), are being used.

Among those display devices, a Liquid Crystal Display (LCD) device includes a display panel and a driving unit. The display panel includes an array substrate including a thin film transistor, which is a switching device for controlling on/off of each pixel area, an upper substrate including color filters and/or black matrixes, and a liquid crystal layer formed between the array substrate and the upper substrate. The driving unit controls the thin film transistor. In the LCD device, alignment of the liquid crystal layer is controlled according to an electric field applied between a common voltage (Vcom) electrode and a pixel (PXL) electrode provided at a pixel area, so as to adjust the transmittance of light and thereby form an image.

The LCD device drives a liquid crystal panel in an inversion type in order to prevent degradation of a liquid crystal and improve display quality. A frame inversion type (i.e., a frame inversion system), a line inversion type (i.e., a line inversion system), a column inversion type (i.e., a line inversion system), a dot inversion type (i.e., a dot inversion system), or the like is used as the inversion type.

Among the inversion driving types, the frame inversion type, the line inversion type and the column inversion type may reduce power consumption compared to the dot inversion type, but have disadvantages in display quality degradation such as a crosstalk phenomenon or an up-down luminance difference. Meanwhile, the dot inversion type may reduce the above-mentioned display quality degradation, and thus may provide an image with quality superior to that of the frame inversion type, the line inversion type and the column inversion type. However, the dot inversion type has disadvantages in that power consumption is too large compared to the line inversion type or the column inversion type.

A type proposed to enhance the above-mentioned problems is a Z-inversion type (i.e., a Z-inversion system). The Z-inversion type is a method in which a Thin Film Transistor (TFT) and a pixel electrode (P) are alternately disposed on left and right of data lines, and a data voltage is provided to the data lines in a column inversion type. That is, the Z-inversion type is an enhanced structure of the column inversion type in which a circuit driving method of the Z-inversion type uses the column inversion, but a screen display is implemented in the same manner as the dot inversion type (i.e., the dot inversion system) by forming TFTs of a liquid crystal panel in an opposite direction with respect to each line. Specifically, the Z-inversion type has an effect similar to that of the dot inversion type with regard to display quality, and uses the column inversion type with regard to data. Thus, the Z-inversion type is a method capable of providing superior image quality and reducing power consumption.

FIGS. 1A and 1B illustrate a thin film transistor positioned in a pixel of a Z-inversion type display device.

In the Z-inversion type display device, a channel of a TFT disposed in some pixels (e.g., pixels disposed in an odd row) is formed in a left direction, and a channel of a TFT disposed in other pixels (e.g., pixels disposed in an even row) is formed in a right direction.

Referring to FIG. 1A, a channel of a TFT disposed on the upper side is formed in a left direction, and a channel of a TFT disposed on the lower side is formed in a right direction.

A drain electrode (i.e., an electrode electrically connected to a pixel electrode) of the TFT should be disposed to the left of a source electrode such that the channel is formed in the left direction. On the contrary, the drain electrode of the TFT should be disposed on the right of the source electrode such that the channel is formed in the right direction.

As described above, in the Z-inversion type display device, a direction in which the drain electrode of the TFT is disposed with respect to the source electrode is different in each pixel. Specifically, the direction in which the drain electrode is disposed with respect to the source electrode in an odd-numbered pixel and the direction in which the drain electrode is disposed with respect to the source electrode in an even-numbered pixel are different.

FIG. 1A illustrates a drain electrode position in a normal case.

Referring to FIG. 1A, an area where a drain electrode 20a and a gate electrode 10a of the upper TFT of which the channel is formed in the left direction are overlapped is substantially the same as an area where a drain electrode 20b and a gate electrode 10b of the lower TFT of which the channel is formed in the right direction are overlapped.

An area where a drain electrode and a gate electrode of a TFT overlap forms a capacitor having a capacitance, and the capacitance is referred to as Cgs. At this time, the capacitance Cgs is determined according to an overlapped area. In the normal case shown in FIG. 1A, the capacitances Cgs of the above-mentioned two TFTs are the same.

Meanwhile, FIG. 1B illustrates a drain electrode position in a case in which a gate electrode layer and source/drain electrode layers are horizontally misaligned by 2.5 um.

The gate electrode layer and the source/drain electrode layers are formed on different layers using different masks. At this time, a reference position of a mask for forming the gate electrode layer and a mask for forming the source/drain electrode layers may be minutely misaligned, for example, the reference position may be horizontally misaligned by 2.5 um. When the reference position is misaligned as described above, the drain electrode may be formed as shown in FIG. 1B.

Referring to FIG. 1B, an area where a drain electrode 20c and a gate electrode 10c of the upper TFT of which the channel is formed in the left direction are overlapped is smaller than an area where a drain electrode 20d and a gate electrode 10d of the lower TFT of which the channel is formed in the right direction are overlapped.

When the areas where the drain electrode and the gate electrode overlap are different as described above, the capacitances Cgs formed in each TFT are different. In the case of FIG. 1B, Cgs of the upper TFT is smaller than Cgs of the lower TFT.

The capacitance Cgs lowers a voltage charged in a pixel, due to a coupling phenomenon which is generated during a gate off, a level of the lowering of the charged voltage is differently determined according to the capacitance Cgs. Therefore, when the capacitances Cgs are different in each pixel, the level of the lowering of the charged voltage in each pixel by the capacitances Cgs becomes different, and thus a charged voltage in each pixel becomes different.

As described above, in the case of the Z-inversion type display device, the gate electrode layer and the source/drain electrode layers may be misaligned for reasons such as a mask misalignment, and, at this time, there are problems in which the capacitances Cgs of each pixel become different.

Therefore, in the Z-inversion type display device, non-uniformity between pixels occurs according to the above-mentioned change. Thus, flickering occurs or a vertical line defect occurs.

SUMMARY OF THE INVENTION

In this background, an aspect of the present invention is to provide a Z-inversion type display device in which a capacitance of Cgs does not change even though a forming position of a source electrode or a drain electrode changes, and a method of manufacturing the Z-inversion type display device.

In accordance with an aspect of the present invention, a Z-inversion type display device comprises: a gate line and a data line that intersect with each other to define a pixel area on a substrate; a thin film transistor that includes a gate electrode, a semiconductor layer, a source electrode and a drain electrode; and a pixel electrode that is formed in the pixel area, and is electrically connected to the drain electrode of the thin film transistor. Here, the drain electrode completely overlaps the gate line such that a drain electrode area is wholly included in a gate line area on a plan view.

According to another aspect of the present invention, a method of manufacturing a Z-inversion type display device comprises: forming a gate line and a gate electrode on a substrate; sequentially forming a gate insulating layer, a semiconductor layer and source/drain metal films on the gate electrode, forming a source electrode, a drain electrode and a data line according to a mask process, and forming the drain electrode such that a drain electrode area is wholly included in a gate line area on a plan view; forming a first protecting layer on the drain electrode, and forming a contact hole on the first protecting layer; and forming a pixel electrode on the first protecting layer through which the contact hole is formed, and forming a second protecting layer on the pixel electrode.

As described above, according to the present invention, there is an effect in which a capacitance Cgs does not change even though a forming position of a source electrode or a drain electrode changes.

In a display device, since capacitances Cgs in each pixel are maintained to be equal, there is an effect in which nonuniformity between pixels is reduced or removed, and problems such as flickering or a vertical line defect are reduced or improved.

In a mass production line, since capacitances Cgs of each product are maintained to be equal, there is an effect in which characteristics between products are uniformly maintained and a quality management becomes easy. Especially, in an existing mass production line, in order to control a change of Cgs, a Cgs compensation pattern is used or Cgs minute adjustment works for each product are performed, but, according to the present invention, there is an effect in which such a secondary process is eliminated.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1A:
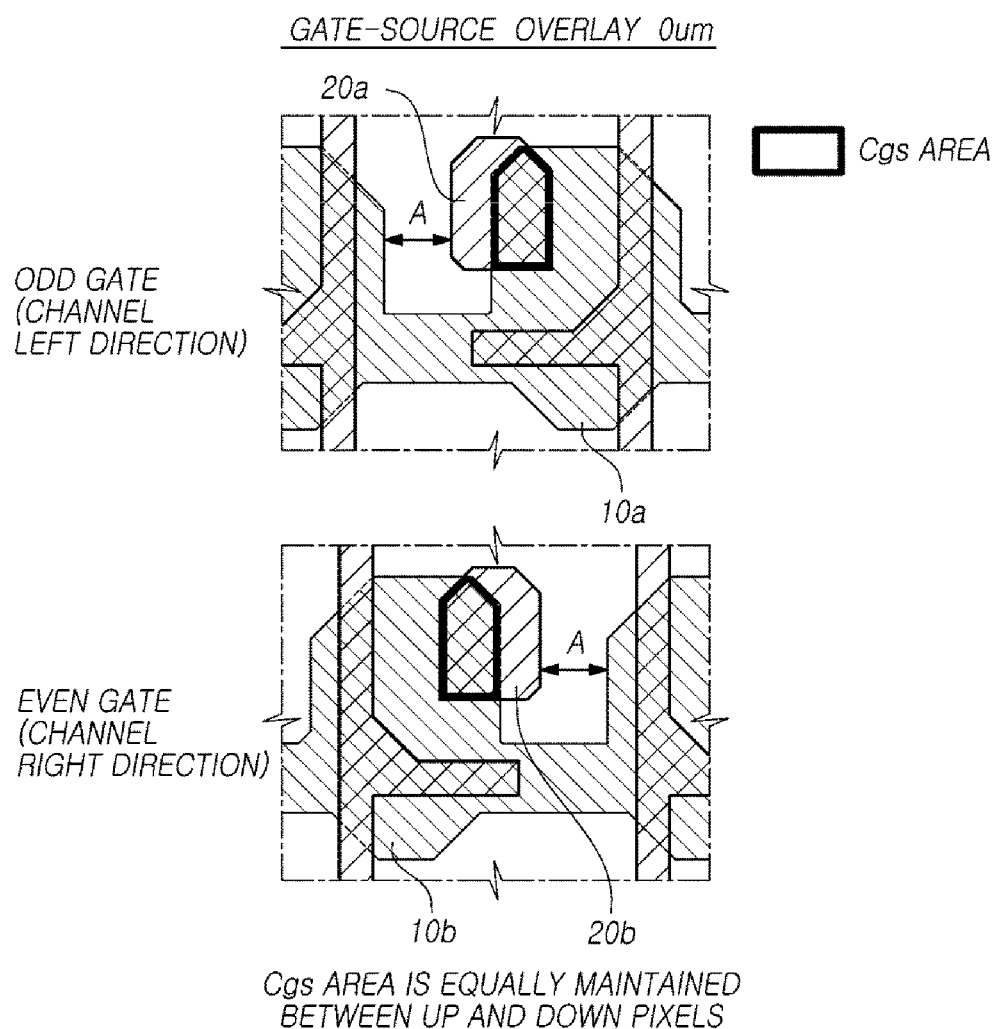
FIGS. 1A and 1B illustrate a thin film transistor positioned in a pixel of a Z-inversion type display device.
Figure 1B:
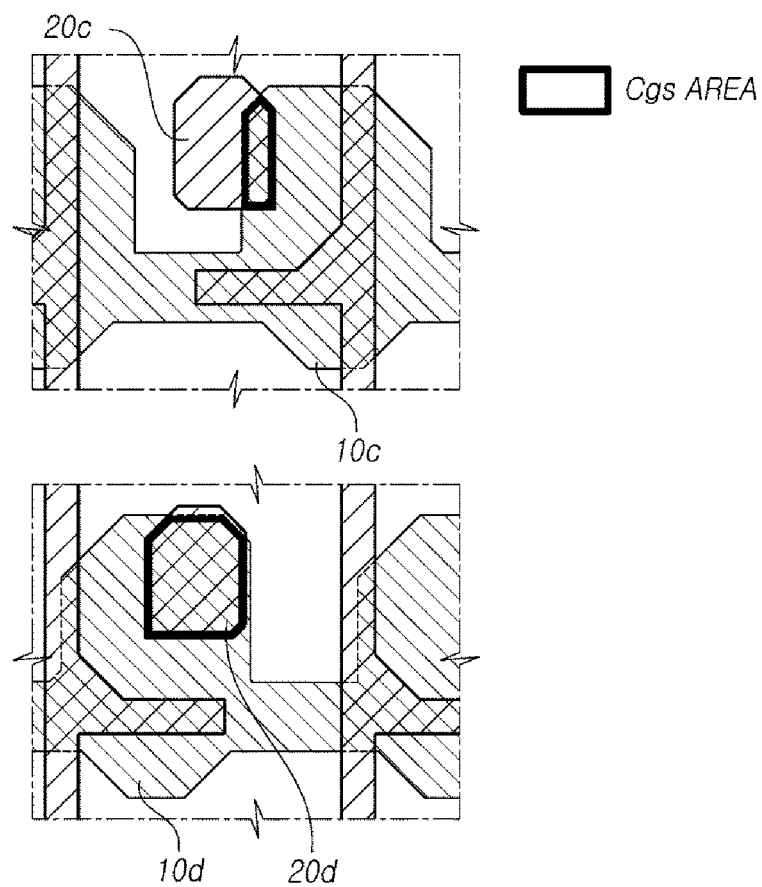

Hereinafter, embodiments of the present invention will be described with reference to the accompanying drawings. In the following description, the same components will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

Figure 2:
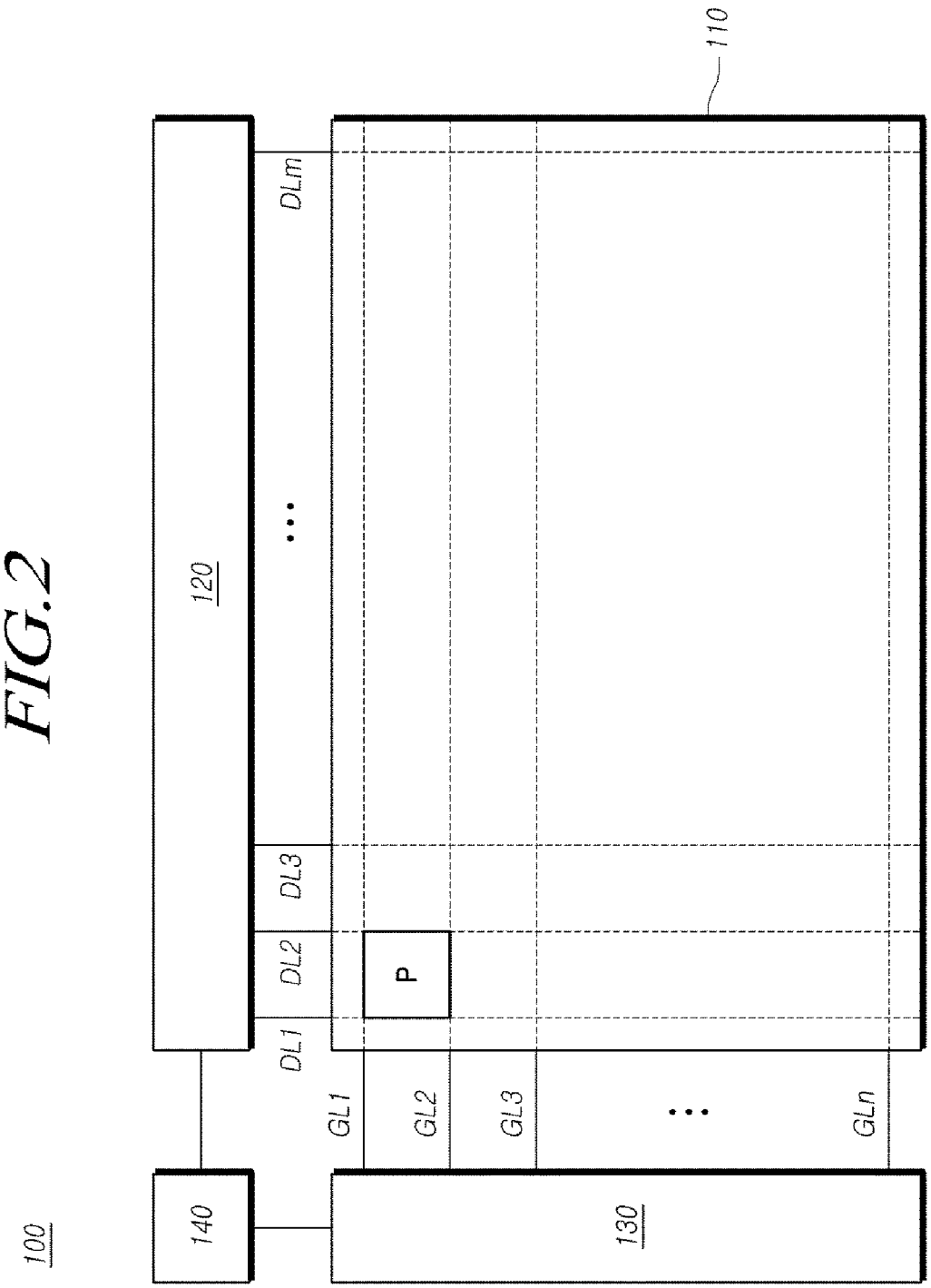
FIG. 2 is a system configuration diagram of a display device according to an embodiment.

FIG. 2 is a system configuration diagram of a display device according to an embodiment.

Referring to FIG. 2, a display device 100 may include a panel 110, a data driving unit 120 and a gate driving unit 130. In addition, the display device 100 may further include a timing controlling unit 140 according to a configuration of an embodiment. In the following, an embodiment in which the display device 100 includes the timing controlling unit 140 is described.

The timing controlling unit 140 may output a Data Control Signal (DCS) for controlling the data driving unit 120 and a Gate Control Signal (GCS) for controlling the gate driving unit 130, based on an external timing signal such as horizontal/vertical synchronization signals (Vsync, Hsync), image data (RGB) and a clock signal (CLK) which are input from a host system (not shown).

In addition, the timing controlling unit 140 may convert the image data (e.g. RGB) input from the host system (not shown) into a data signal form used in the data driving unit 120, and may provide the converted image data (R'G'B') to the data driving unit 120. For example, the timing controlling unit 140 may provide the image data (R'G'B') converted correspondingly to a resolution or a pixel structure of the panel 110. Here, the image data (RGB) and the converted image data (R'G'B') may be referred to as an image signal, image digital data, or data.

The data driving unit 120 converts the converted image data (R'G'B') into a data voltage (i.e., an analog pixel signal or a data signal) which is a voltage corresponding to a gray value, and provides the data voltage to a data line, in response to the DCS and the converted image data (R'G'B') input from the timing controlling unit 140.

The gate driving unit 130 sequentially provides a gate signal (i.e., a scan signal, a gate pulse, a scan pulse or a gate on signal) to a gate line, in response to the GCS input from the timing controlling unit 140.

The panel 110 includes a plurality of pixels P defined by an intersection of a plurality of gate lines GL1 to GLn and a plurality of data lines DL1 to DLm.

In each pixel of the panel 110, a transistor, e.g. a field effect transistor, e.g. a Thin Film Transistor (TFT) connected to the gate line GL and the data line DL and disposed between the gate line GL and the data line DL may be formed. The gate driving unit 130 provides a gate signal to the gate line GL and turns on the TFT to enable the data line DL to be connected to the pixel. In addition, a data voltage output from the data driving unit 120 is applied to the pixel connected to the data line DL and an image is displayed.

Each pixel may have a different structure according to an image display method. For example, when the panel 110 displays an image according to a liquid crystal display method, a pixel may have a structure in which a liquid crystal is interposed between both electrodes.

As another example of a pixel, when the panel 110 displays an image according to an organic light emitting method, the pixel may include at least one organic light emitting element including an anode which is a first electrode, a cathode which is a second electrode, and a light emitting layer. The light emitting layer in each organic light emitting element may include at least one light emitting layer among red, green, blue and white light emitting layers, or a white light emitting layer.

Hereinafter, for the convenience of description, an embodiment in which the panel 110 displays an image according to the liquid crystal display method will be described. However, as described above, the panel 110 may display an image by another method (e.g., the organic light emitting method), and the present invention is not limited such an image display method.

The panel 110 includes an array substrate, an upper substrate and a liquid crystal material layer. The array substrate includes a thin film transistor which is a switching element for controlling turning on and turning off of each pixel. The upper substrate includes a color filter and/or a black matrix. The liquid crystal material layer is interposed between the array substrate and the upper substrate. In the liquid crystal display method, an arrangement state of a liquid crystal layer is controlled according to an electric field applied between a pixel (P) electrode and a common voltage (Vcom) electrode in a pixel area, and transmittance of light is controlled by the control of the arrangement state of a liquid crystal, and an image is displayed.

In the array substrate, an Active Area (AA) which includes at least one pixel displaying an image and a Non-active Area (NA) are defined. In the Active Area (AA) of the array substrate which is usually referred to as a lower substrate, the pixel P is defined by the intersection of the plurality of gate lines GL and the plurality of data lines DL. The TFT is disposed at each intersection points, and each TFT is connected to a transparent pixel electrode formed in each pixel P in one to one correspondence.

In the array substrate, a plurality of layers such as a gate metal layer, a semiconductor layer, source/drain metal layers, a pixel electrode layer, and a common electrode layer may be formed in order to form the TFT, a line and the like, a dielectric layer, a protecting layer, or the like for insulating each layer or for protecting each layer may be formed.

Meanwhile, there is a Twisted Nematic (TN) scheme, in which a liquid crystal is injected between an array substrate having a pixel electrode formed therein and an upper substrate having a common voltage electrode formed therein, separated from each other, and liquid crystal molecules in a nematic phase are driven in a direction perpendicular to the substrates. However, a liquid crystal display device of the twisted nematic scheme as described above is disadvantageous in that it has a narrow viewing angle of about 90 degrees.

Therefore, there is an In Plane Switching (IPS) scheme liquid crystal display device which drives liquid crystal molecules in a direction parallel to the substrate to improve a viewing angle to not less than 170 degrees. The IPS scheme liquid crystal display device includes a type in which basically a pixel electrode and a common electrode are simultaneously formed on a lower substrate or an array substrate, and both electrodes are formed in the same layer, and a Fringe Field Switching (FFS) type in which both electrodes are spaced apart in a horizontal direction by at least one insulating layer, and one electrode has a finger shape.

Further, a connection pad for connection to a driving unit disposed at an inner or outer portion of the substrate, a signal application pad for applying a reference voltage or reference signals, and various pads for measurement may be formed on a part of the Non-Active area (NA) outside of the Active Area (AA) in the array substrate.

Meanwhile, as described above, in order to prevent a degradation of a liquid crystal and improve display quality, the liquid crystal display device drives a liquid crystal panel in an inversion type. A frame inversion type (i.e., a frame inversion system), a line inversion type (i.e., a line inversion system), a column inversion type (i.e., a line inversion system), a dot inversion type (i.e., a dot inversion system), or the like is used as the inversion type.

Among the inversion driving types, the frame inversion type, the line inversion type and the column inversion type may reduce power consumption compared to the dot inversion type, but have disadvantages of display quality degradation such as a crosstalk phenomenon or an up-down luminance difference. Meanwhile, the dot inversion type may reduce the above-mentioned display quality degradation, and thus may provide an image with quality superior to that of the frame inversion type, the line inversion type and the column inversion type. However, the dot inversion type has disadvantages in that power consumption is too large compared to that of the line inversion type or the column inversion type.

A type proposed to enhance the above-mentioned problems is a Z-inversion type (i.e., a Z-inversion system). The Z-inversion type may be applied to the panel 110 of FIG. 2.

A pixel structure of the Z-inversion type display device is different from other inversion types (e.g., the frame inversion type, the column inversion type, and the like).

Figure 3:
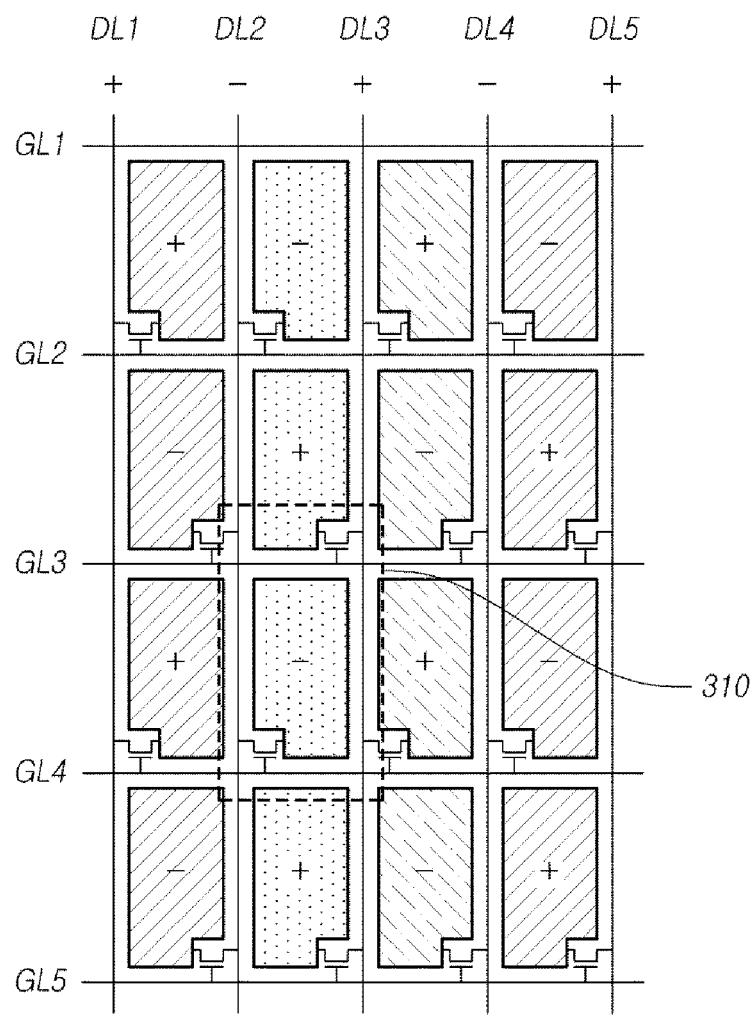
FIG. 3 is a pixel structure diagram for a Z-inversion type array substrate which may be applied to a panel of FIG. 2.

FIG. 3 is a pixel structure diagram for a Z-inversion type array substrate which may be applied to the panel of FIG. 2. For the convenience of description, FIG. 3 shows an enlarged view of a portion corresponding to some data lines DL1 to DL5 and some gate lines GL1 to GL5 in the panel 110 of FIG. 2. It may be understood that such a pixel structure is repeated in the remaining portions.

Referring to FIG. 3, the pixels are defined by the intersections of the plurality of gate lines GL1 to GL5 and the plurality of data lines DL1 to DL5. Here, each pixel is connected to the data lines in left and right directions alternately. Specifically, the TFTs disposed in each pixel are connected to the data lines, and the source electrodes of the TFTs are connected to the data lines in the left and right directions alternately.

Referring to FIG. 3, a data voltage of a positive polarity (+) is provided to odd-numbered data lines DL1, DL3 and DL5, and a data voltage of a negative polarity (−) is provided to even-numbered data lines DL2 and DL4. Since the TFTs of the pixels are connected to the data lines in the left and right directions alternately, when a data voltage of a specific polarity is provided to one data line, the data voltage is alternately provided to a left pixel of the data line and a right pixel of the data line.

As described above, the data voltage is provided according to the column inversion type (a type in which data voltages of different polarities are provided to each data line), but an inversion type of the pixel is equal to the dot inversion type (an inversion type in which pixels having the same polarity are not adjacent in horizontal and vertical directions. Thus, power consumption can be reduced as in the column inversion type, and superior display quality can be obtained as in the dot inversion type.

Figure 4:
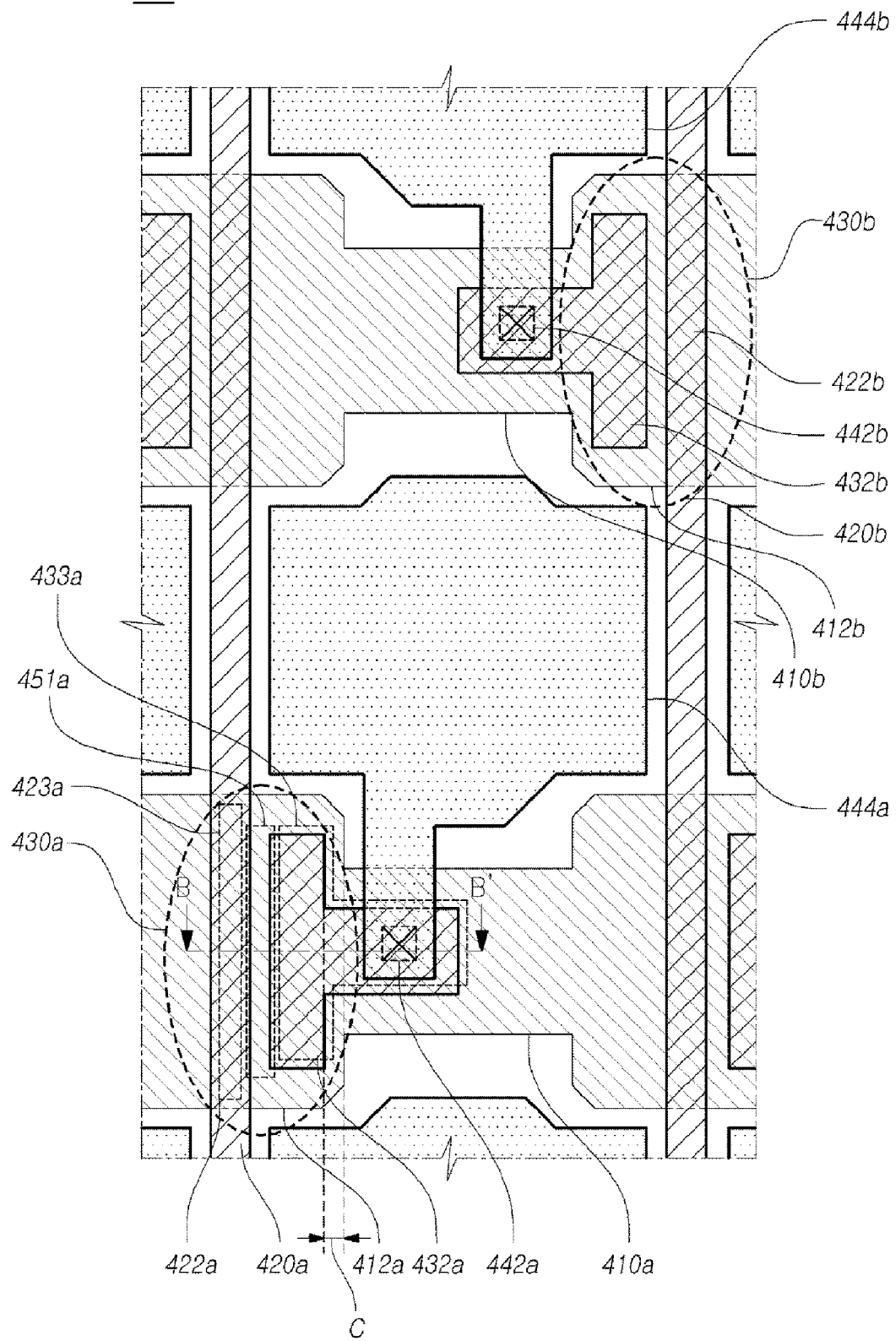
FIG. 4 is a plan view of the array substrate for illustrating a portion of FIG. 3.

FIG. 4 is a plan view of the array substrate for illustrating a portion of FIG. 3. FIG. 4 is view for an area 310 of FIG. 3. It may be understood that the same structure is repeated in the remaining portions.

Referring to FIG. 4, a first gate line 410a is disposed in a direction on a substrate, and a first data line 420a is disposed in a direction perpendicular to the first gate line 410a. A first pixel electrode 444a and a first TFT 430a are disposed on the right side of the first data line 420a, and a first pixel is formed.

In addition, a second gate line 410b is disposed in parallel with the first gate line 410a, and a second data line 420b is disposed in parallel with the first data line 420a. A second pixel electrode 444b and a second TFT 430b are disposed on the left side of the second data line 420b, and a second pixel is formed.

Referring to FIG. 4, the first TFT 430a and the second TFT 430b are symmetric in the horizontal direction, and formed in different directions.

The first TFT 430a includes a first source electrode 422a, a first drain electrode 432a, and a first gate electrode 412a. The first source electrode 422a is a portion of the first data line 420a which is disposed on the left side thereof and has an 'I' shape. The first drain electrode 432a has a 'T' shape in which a side of the first drain electrode 432a is parallel with the first source electrode 422a and another side of the first drain electrode 432a protrudes. In particular, the 'T' shape first drain electrode 432a has a horizontal leg and a vertical leg. The horizontal leg of the 'T' shape drain electrode is arranged adjacent to the first source electrode 422a and extends in parallel with the first source electrode 422a. The vertical leg of the 'T' shape first drain electrode protrudes from the horizontal leg away from the first source electrode 422a. The first TFT 430a is formed in the lower-left side of the first pixel.

The second TFT 430b includes a second source electrode 422b, a second drain electrode 432b, and a second gate electrode 412b. The second source electrode 422b is a portion of the second data line 420b which is disposed on the right side thereof and has an 'I' shape. The second drain electrode 432b has a 'T' shape in which a side of the second drain electrode 432b is parallel with the second source electrode 422b and another side of the second drain electrode 432b protrudes. In particular, the 'T' shape second drain electrode 432b has a horizontal leg and a vertical leg. The horizontal leg of the 'T' shape drain electrode is arranged adjacent to the second source electrode 422b and extends in parallel with the second source electrode 422b. The vertical leg of the 'T' shape second drain electrode protrudes from the horizontal leg away from the second source electrode 422b. The second TFT 430b is formed in the lower-right side of the second pixel.

As described above, in the Z-inversion type display device 100, the directions of the TFTs in the pixels adjacent in vertical directions are different. As described above, when the directions of the TFTs are different in each pixel, a deviation of Cgs may be generated due to a misalignment of the gate electrode layer and source/drain electrode layers.

In the array substrate of FIG. 4, the drain electrode completely overlaps the gate line in order to resolve the Cgs deviation.

Referring to FIG. 4, the first drain electrode 432a of the first TFT 430a completely overlaps the first gate line 410a. The plan view of FIG. 4 shows an overlap shape in which the first drain electrode 432a of the first TFT 430a is wholly included in the first gate line 410a.

In addition, the first drain electrode 432a may overlap (e.g. laterally overlap) the first gate line 410a with a margin. In the plan view of FIG. 4, the overlap with the margin means that the first drain electrode 432a is disposed within a margin distance C from an edge of the first gate line 410a.

A reference numeral 433a indicates a first drain electrode misaligned by a predetermined distance and formed in another position due to a problem of a process. When this is referred to a first drain electrode' 433a, since a misalignment distance is shorter than the margin distance C, the first drain electrode' 433a completely overlaps the first gate line 410a.

In the plan view of FIG. 4, when the first drain electrode 432a is compared with the first drain electrode' 433a, an area where the first drain electrode 432a overlaps the first gate line 410a is equal to an area where the first drain electrode' 433a overlaps the first gate line 410a. Therefore, a capacitance Cgs formed by the first drain electrode 432a and the first gate line 410a is equal to a capacitance Cgs formed by the first drain electrode' 433a and the first gate line 410a, and thus the problem of the Cgs deviation becomes resolved.

In the same manner, even in the second TFT which is symmetric to the first TFT 430a, the second drain electrode 432b completely overlaps the second gate line 410b. The plan view of FIG. 4 shows an overlap shape in which the second drain electrode 432b of the second TFT 430b is wholly included in the second gate line 410b. In addition, the second drain electrode 432b may overlap the second gate line 410b with a margin in a method similar to that of the first drain electrode 432a.

Meanwhile, in the array substrate shown in FIG. 4, even source electrode may completely overlap the gate line.

Referring to FIG. 4, the first source electrode 422a of the first TFT 430a is a portion of the first data line 420a and has an 'I' shape. When the source electrode is formed of the portion of the data line as described above, an area of the source electrode may be defined a portion where the data line and the gate line overlap in a data line direction. In the case of the first source electrode 422a, a portion corresponding to a first source electrode area 423a where the first data line 420a overlap the first gate line 410a corresponds to the first source electrode 422a.

Referring to FIG. 4, since the first source electrode 422a is the portion of the first data line 420a and has the 'I' shape, the first source electrode 422a always overlaps the first gate line 410a in the data line direction. In contrast, the first source electrode 422a may or may not overlap the first gate line 410a in a gate line direction according to a position of the source electrode 422a. In the array substrate shown in FIG. 4, the first source electrode 422a is positioned so as to completely overlap the first gate line 410a. As described above, an overlap relation may be identified in the plan view, and referring to FIG. 4, an area of the first source electrode 422a is included in an area of the first gate line 410a.

Although a detailed description is omitted, even the second source electrode 422b also completely overlaps the second gate line 410b in the same manner as the first source electrode 422a.

As described above, when the drain electrode completely overlaps the gate line, the capacitance (Cgd) formed between the drain electrode and the gate line is uniformly maintained in each pixel. Since the capacitance (Cgd) between the drain electrode and the gate line lowers a charged voltage which is charged in a pixel, like the capacitance Cgs, the capacitance Cgd should be uniform in every pixels. In the array substrate shown in FIG. 4, since the Cgd is uniformly maintained in each pixel, a flickering problem or a vertical line problem generated due to a nonuniformity between pixels is resolved.

When the source electrode and the drain electrode completely overlap the gate line, a channel between the source electrode and the drain electrode completely overlaps the gate line.

Referring to FIG. 4, a first channel 451a between the first source electrode 422a and the first drain electrode 432a is positioned in order to completely overlap the first gate line 410a. The first channel 451a may overlap the first gate line 410a automatically because the first source electrode 422a and the first drain electrode 432a completely overlap the first gate line 410a. However, the first channel 451a may be positioned to completely overlap the first gate line 410a autonomously according to a position adjustment by a design.

A channel characteristic may be changed according to an area where the channel overlaps the gate line, and as shown in FIG. 4, when the channel completely overlaps the gate line in each pixel, the channel characteristics of all pixels are the same.

Referring to FIG. 4, the first pixel electrode 444a is electrically connected to the first TFT 430a. In particular, the first pixel electrode 444a is electrically connected to the first drain electrode 432a of the first TFT 430a. For example, the first pixel electrode 444a is electrically connected to the vertical leg of the first drain electrode 432a via a contact hole 442a. The contact hole 442a completely overlaps the first gate line 410a.

The width of the first gate line 410a may not be uniform. For example, the first gate line 410a may includes portions of different widths. A width of a portion of the first gate line which includes the first contact hole 442a is a width in a direction parallel to the extension of the first data line 420a. A width of a portion of the first gate line which includes the horizontal leg of the 'T' shape first drain electrode is a width in a direction parallel to the extension of the first data line 420a. The width of the portion of the first gate line 410a which accommodates the first contact hole 442a may be different from the width of the portion of the first gate line 410a which accommodates the horizontal leg of the 'T' shape first drain electrode 432a. For example, the width of the portion of the first gate line 410a which accommodates the first contact hole 442a may be smaller than the width of the portion of the first gate line 410a which accommodates the horizontal leg of the first drain electrode 432a.

The first gate line 410a may include an first edge and a second edge in parallel to the first data line 420a. The first edge of the first gate line is adjacent to an edge of the horizontal leg of the 'T' shape first drain electrode which faces away the first data line 420a. The second edge of the first gate line is adjacent to the second data line 420b. In other words, the first edge of the first gate line is closer to the first data line 420a and the second edge of the first gate line is closer to the second data line 420b.

Similarly, the second gate line 410b which is parallel to the first gate lines 410a may also include a first edge and second edge in parallel to the second data line 420b. The first edge of the second gate line is adjacent to the first data line 420a. The second edge of the second gate line is adjacent to an edge of the horizontal leg of the 'T' shape second drain electrode which faces away the second data line 420b. In other words, the first edge of the second gate line is closer to the first data line 420a and the second edge of the second gate line is closer to the second data line 420b.

The first edge of the first gate line (i.e., adjacent to the horizontal leg of the first drain electrode) is closer to the first data line 420a than the edge of the second gate line (i.e., adjacent to the horizontal leg of the second drain electrode) to the first data line 420a. In other words, the first drain electrode 432a is closer to the first data line 420a than the second drain electrode 432b, as shown in FIG. 4.

Although a detailed description is omitted, the second gate line 410b may have the same configuration and similarly accommodate a second contact hole 442b as the first gate line 410a.

As shown in FIG. 4, the first TFT 430a and second TFT 430b form a transistor pair. The first TFT 430a which has a 'T' shape first drain electrode 432a is rotated 90° in a counterclockwise direction and the second TFT 430b which has a 'T' shape second drain electrode 432b is rotated 90° in a clockwise direction.

Figure 5:
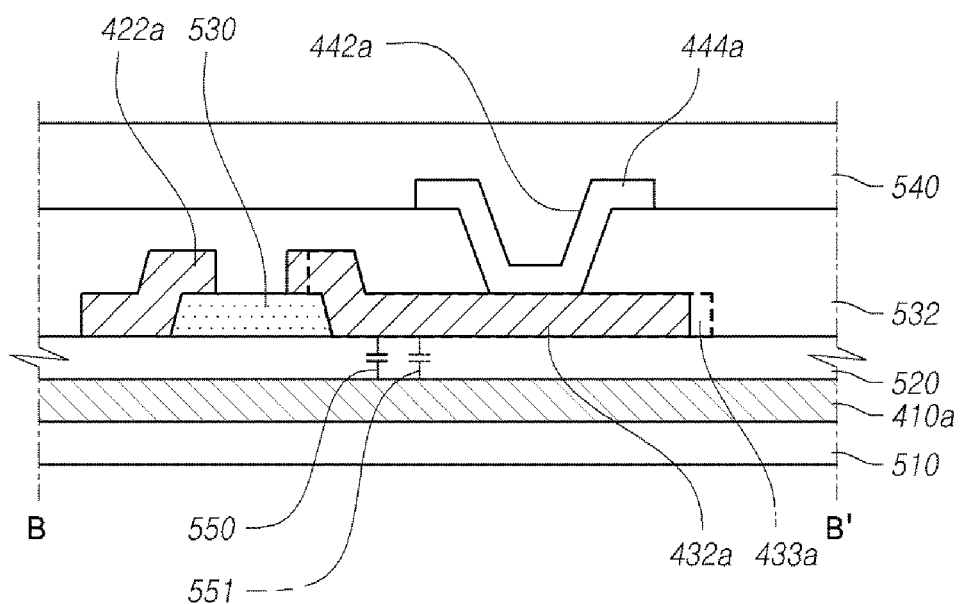
FIG. 5 is a cross-sectional view taken along a line B-B' of FIG. 4.

FIG. 5 is a cross-sectional view taken along a line B-B' of FIG. 4.

Referring to FIG. 5, the first gate line 410a is formed using a metal layer or a metal pattern on a substrate 510 such as an organic substrate, and a gate insulating layer (i.e., a Gate Insulator (GI)) 520 is formed on the first gate line 410a. A semiconductor layer 530 forming the channel of the TFT is formed on the GI 520, and a metal layer or a metal pattern forming the first source electrode 422a and the first drain electrode 432a is laminated on the semiconductor layer 530.

A first protecting layer 532 is formed on the first source electrode 422a and the first drain electrode 432a. The first protecting layer 532 may be an inorganic protecting layer formed of inorganic insulating material such as nitride silicon (SiNx) or oxide silicon (SiO2), and may be an organic protecting layer formed of material such as photoacryl, acrylate and polyamide. In some cases, the first protecting layer 532 may be a double structure including the inorganic protecting layer and the organic protecting layer.

A first contact hole 442a is formed in the first protecting layer 532. In addition, a first pixel electrode 444a is electrically connected to the first drain electrode 432a through the first contact hole 442a.

A second protecting layer 540 is formed on the first pixel electrode 444a. The second protecting layer 540 may be an inorganic protecting layer formed of inorganic insulating material such as nitride silicon SiNx or oxide silicon SiO2.

FIG. 5 shows the first drain electrode 432a formed at a position according to a design value, together with the first drain electrode' 433a which is somewhat moved from the design value and is formed. In addition, FIG. 5 shows Cgs 550 formed by the first drain electrode 432a and the first gate line 410a, together with Cgs' 551 formed by the first drain electrode' 433a and the first gate line 410a, for a comparison.

Referring to FIG. 5, an area where the drain electrode 432a disposed to the design value overlaps the first gate line 410a is the same as an area where the drain electrode' 433a moved and is disposed from the design value overlaps the first gate line 410a. This is because the first drain electrode 432a completely overlaps the first gate line 410a. More specifically, in a cross-sectional view of FIG. 5, this is because both of an area of the first drain electrode 432a and an area of the first drain electrode' 433a are in an area of the first gate line 410a. Therefore, a capacitance Cgs 550 formed by the first drain electrode 432a which is disposed at the design value becomes identical to Cgs' 551 formed by the first drain electrode' 433a.

Referring to FIG. 5, the first source electrode 422a and the semiconductor layer 530 also completely overlap the first gate line 410a.

FIGS. 6A to 6D are cross-sectional views taken along a line B-B' for illustrating a manufacturing process for the array substrate of FIG. 4.

Figure 6A:
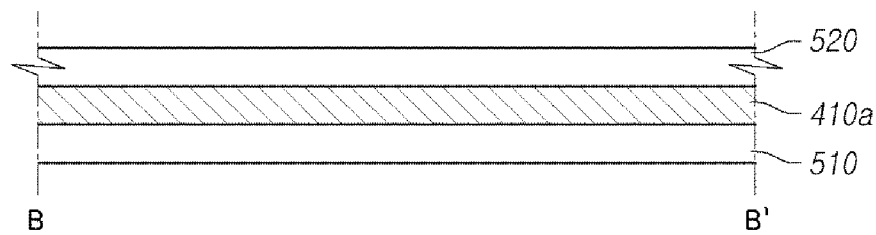
FIGS. 6A to 6D are cross-sectional views taken along a line B-B' for illustrating a manufacturing process for the array substrate of FIG. 4.

Referring to FIG. 6A, the first gate line 410a is formed using a metal layer or a metal pattern on the substrate 510 such as an organic substrate. The gate insulating layer 520 (i.e., the Gate Insulator (GI)) is formed on the first gate line 410a. At this time, the GI 520 may be an inorganic insulating material, for example, may be one selected from oxide silicon, nitride silicon or multiple layers thereof. The metal layer forming the first gate line 410a may have single layer or multiple layers by depositing one or more material selected from copper (Cu), copper alloy, aluminum (Al), aluminum alloy (AlNd), molybdenum (Mo) and molybdenum alloy (Mori).

Figure 6B:
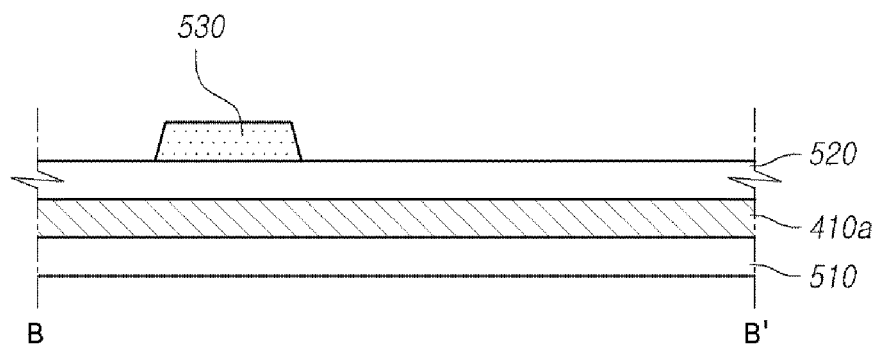

Referring to FIG. 6B, the semiconductor layer 530 is formed on the GI 520. The semiconductor layer 530 may form a source area and a drain area by doping a P type impurity or an N type impurity, and may define a channel area interposed between the source area and the drain area, simultaneously. In the case of a P type transistor, a group 3 element such as boron (B), aluminum (Al), gallium (Ga) and indium (In) may be used as the doped impurity. In the case of an N type transistor, a group 5 element such as phosphorus (P), arsenic (As) and antimony (Sb) may be used as the doped impurity. A hole is used as a carrier in the P type transistor, and an electron is used as a carrier in the N type transistor.

Figure 6C:
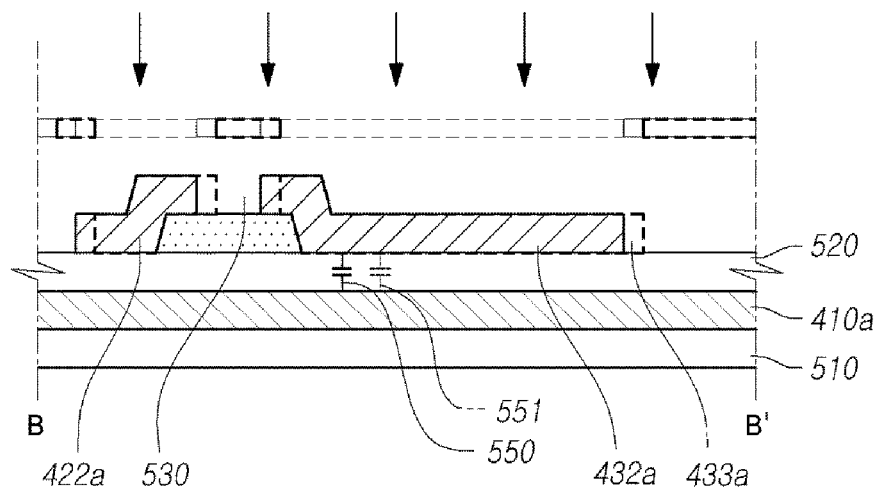

Referring to FIG. 6C, source/drain metal films are formed on the semiconductor layer 530, and the first source electrode 422a and the first drain electrode 432a are patterned using a mask process. At this time, the first source electrode 422a and the first drain electrode 432a may be formed of a metal material having a low resistance characteristic, such as copper (Cu), copper alloy, aluminum (Al) and aluminum alloy (AlNd).

However, in this process, as shown in FIG. 6C, the mask for patterning an electrode may be somewhat moved. When the mask is somewhat moved, the first drain electrode' 433a may be formed, which is somewhat moved from a design value, rather than the first drain electrode 432a corresponding to a position of the design value. Therefore, Cgs' 551 may be formed rather than Cgs 550.

In a first embodiment, in order to maintain the capacitance Cgs' 551 equally to the capacitance Cgs 550, the first drain electrode 432a is formed such that the first drain electrode 432a completely overlaps the first gate line 410a. According to an embodiment, in a plan view, the first drain electrode 432a is formed such that the area of the first drain electrode 432a is formed within the margin distance from the edge of the area of the first gate line 410a. Here, the margin distance is determined according to an error range of the mask process.

Figure 6D:
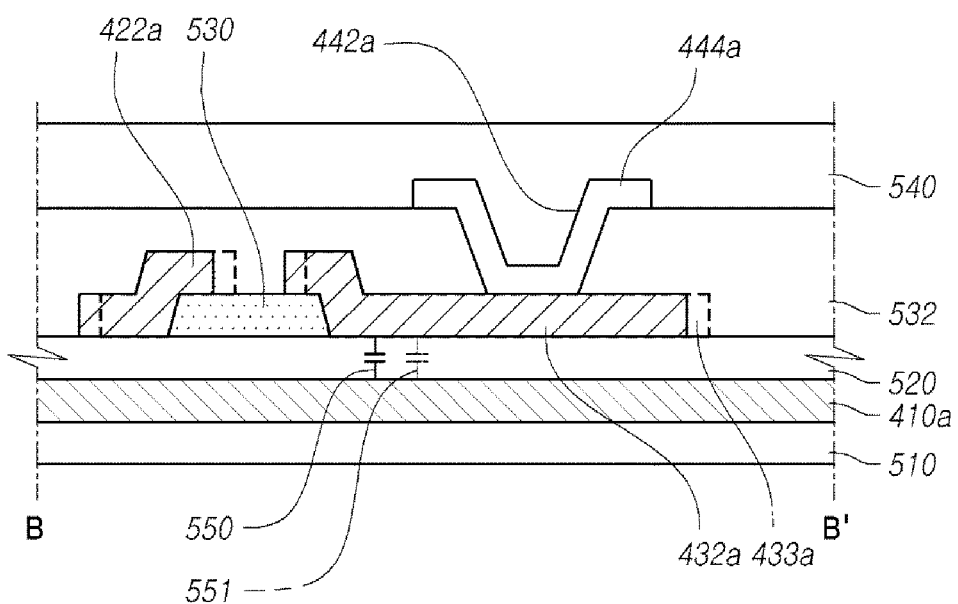

Referring to FIG. 6D, the first protecting layer 532 is formed on the first source electrode 422a and the first drain electrode 432a. In addition, the first contact hole 442a is formed on the first protecting layer 532, the first pixel electrode 444a which is connected to the first drain electrode 432a is formed on the first protecting layer 532, and the second protecting layer 540 is formed on the first pixel electrode 444a. The first protecting layer 532 or the second protecting layer 540 may be an inorganic protecting layer formed of inorganic insulating material such as nitride silicon (SiNx) or oxide silicon (SiO2), and may be an organic protecting layer formed of material such as photoacryl, acrylate and polyamide. In some cases, the first protecting layer 532 or the second protecting layer 540 may be a double structure including the inorganic protecting layer and the organic protecting layer.

Figure 7A:
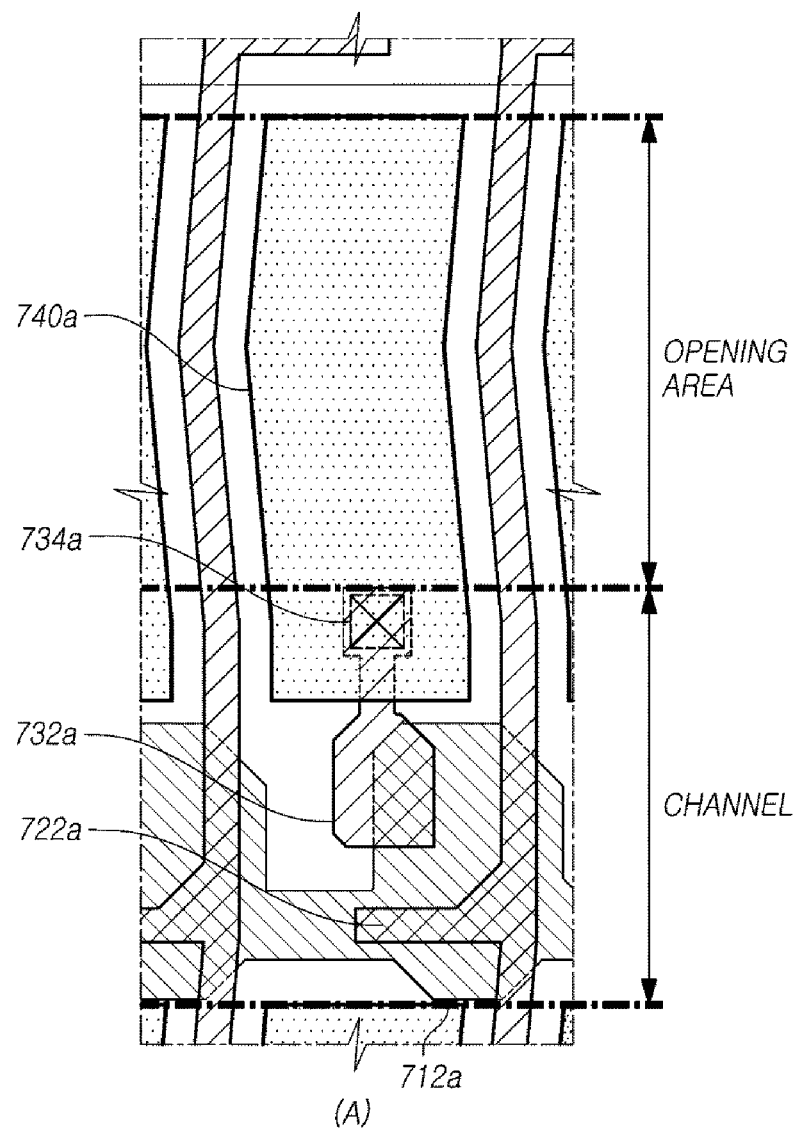
FIGS. 7A and 7B are views illustrating an opening area of a display device according to an embodiment.
Figure 7B:
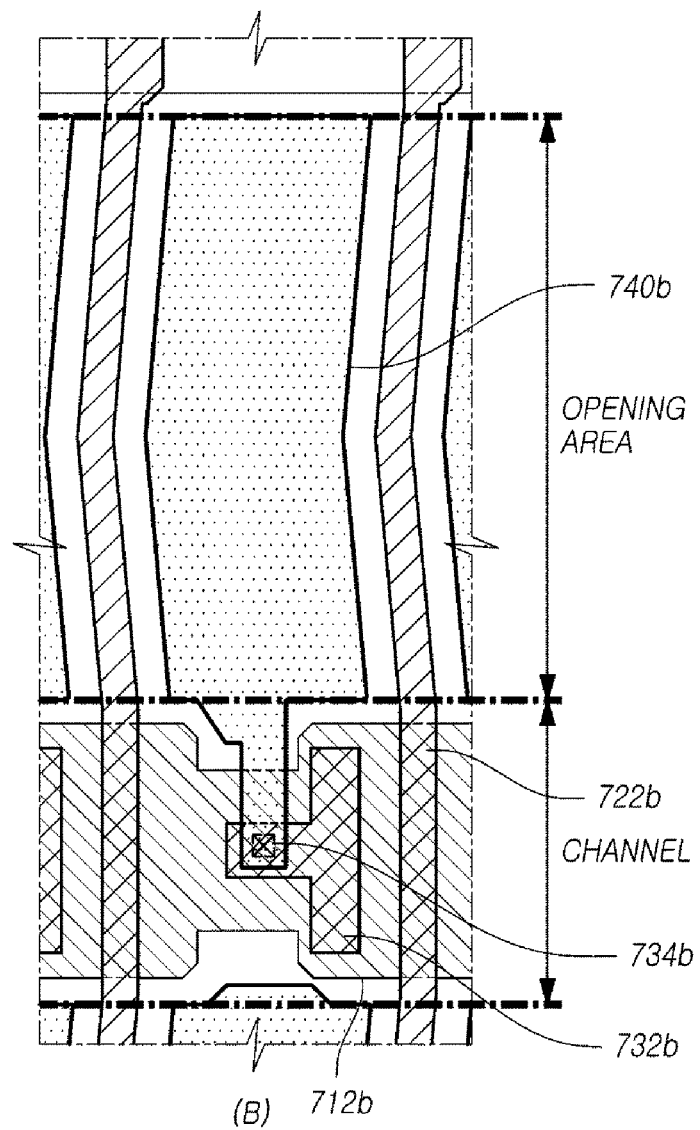

FIGS. 7A and 7B are views illustrating an opening area of a display device according to a compared array substrate and an embodiment.

FIG. 7A is a plan view of a compared array substrate. FIG. 7B is a plan view of an array substrate according to an embodiment.

Referring to FIG. 7A, in the compared array substrate, a source electrode 722a has an 'L' shape, and thus a portion of the source electrode 722a protrudes toward a gate line. Therefore, in the compared array substrate, a contact hole 734a for connecting a pixel electrode 740a is formed at an upper position compared to a data line direction edge of a gate electrode 712a. As described above, when a position of the contact hole 734a moves upward, there is a problem in which an opening area becomes narrower according to the movement of the contact hole 734a.

Referring to FIG. 7B, in the array substrate according to an embodiment, a source electrode 722b has an 'I' shape. Since the source electrode 722b has the 'I' shape, an area occupied by the source electrode 722b in a gate line direction is reduced, and thus an area where other components of a TFT are formed becomes comparatively larger. Therefore, a drain electrode 732b does not move upward, and is formed in parallel with the gate line. Thus, in the array substrate in an embodiment, a contact hole 734b is formed at a lower position compared to a data line direction edge of a gate electrode 712b. As described above, when a position of the contact hole 734b is moved downward, an opening area becomes larger according to the movement of the contact hole 734b. Specifically, in a high resolution panel, an area of each pixel is reduced, and when a source electrode is formed in an 'I' shape like the embodiment in such a panel, an opening ratio may be more increased.

Figure 8:
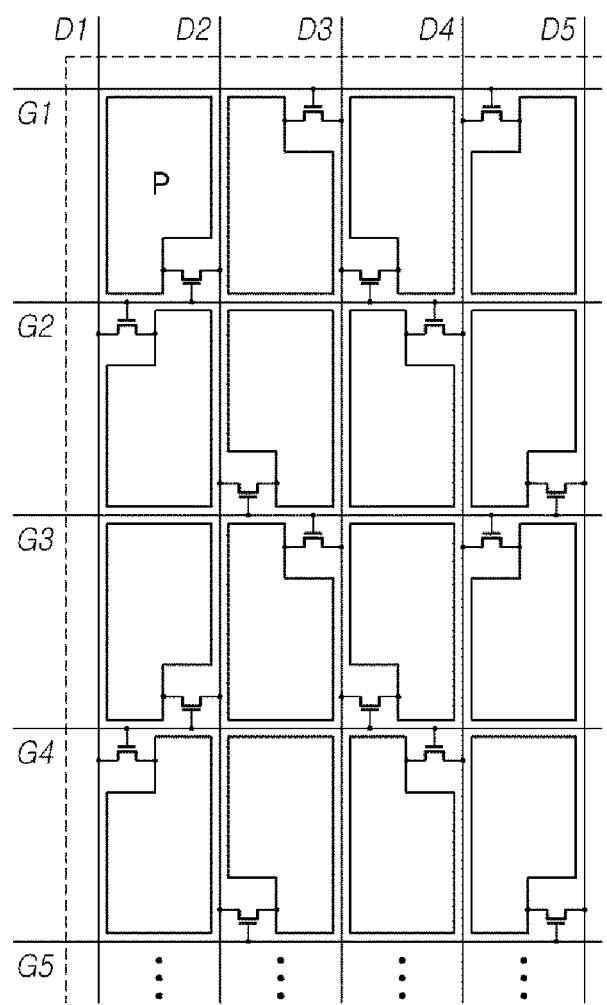
FIG. 8 is a pixel structure diagram of another array substrate which may be applied to the panel of FIG. 2.

FIG. 8 is a pixel structure diagram of another array substrate which may be applied to the panel of FIG. 2.

Referring to FIG. 8, TFTs are alternately connected to the left side of a data line and the right side of the data line, like a Z-inversion type. The array substrate shown in FIG. 8 is different from the array substrate shown in FIG. 3, in which the TFTs are alternately connected to the upper side of a gate line and the lower side of the gate line.

As described above, when the TFTs are disposed in different directions of the upper side and the lower side, a deviation of Cgs or Cgd in a vertical direction may be generated due to a misalignment of a mask, like the existing Z-inversion pixel structure.

However, such problems may be resolved by a concept of an embodiment of the present invention. The concept of an embodiment is positioning a drain electrode or a source electrode such that the drain electrode or the source electrode completely overlaps a gate line. As described above, when the drain electrode or the source electrode completely overlaps the gate line, although a mask is misaligned in a vertical direction (i.e., a data line direction), a deviation of Cgs or Cgd is not generated.

As described above, when the source electrode and/or the drain electrode is positioned to completely overlap the gate line, there is an effect in which Cgs in each pixel is substantially the same.

As described above, when the capacitance Cgs is substantially the same in each pixel, in a display device, there is an effect in which nonuniformity between pixels is removed, and problems such as flickering or a vertical line defect are improved. Specially, in a pixel structure of a Z-inversion type or a pixel structure in which the TFTs are alternately disposed at the upper side and the lower side of the gate line, Cgs may be changed in each pixel according to an error of a process. However, according to the embodiment of the present invention, there is an effect in which Cgs is uniformly maintained in such a pixel structure.

In a mass production line, since capacitances Cgs of each product are maintained to be equal, there is an effect in which characteristics between products are uniformly maintained and quality management becomes easy. Especially, in an existing mass production line, in order to control a change of Cgs, a Cgs compensation pattern is used or Cgs minute adjustment works for each product are performed, but, according to the present invention, there is an effect in which such a secondary process is eliminated.

Figure 9A:
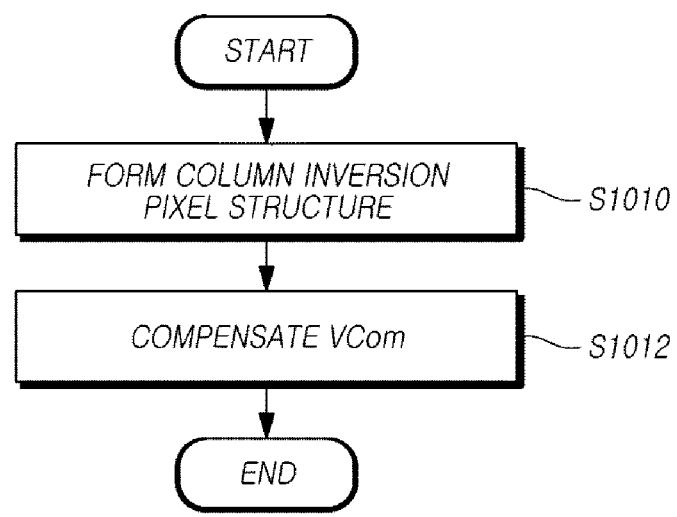
FIGS. 9A and 9B are views illustrating a flow of a normal Cgs compensation process.
Figure 9B:
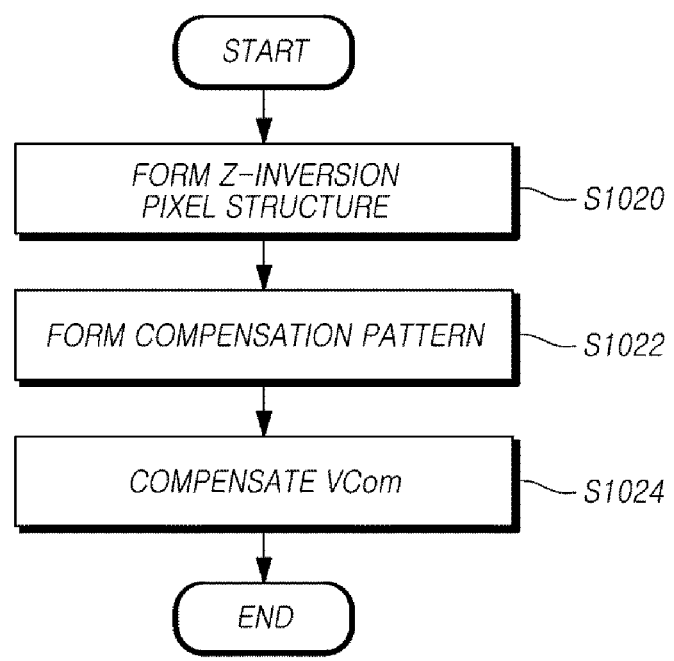

FIGS. 9A and 9B are views illustrating a flow of a normal Cgs compensation process.

FIG. 9A is a Cgs compensation process of a display device having an existing column inversion pixel structure.

FIG. 9B is a Cgs compensation process of a display device having an existing Z-inversion pixel structure.

Referring to FIG. 9A, in the display device having the existing column inversion pixel structure, an array substrate of a column inversion pixel structure is formed (S1010). When a capacitance Cgs is out of a normal range, Cgs has been compensated through a common voltage (Vcom) compensation. In a case of the column inversion pixel structure, when an error of a mask is generated, the Cgs of all pixels is consistently changed. Thus, in this case, a Cgs deviation between pixels is not generated in one display device. However, when Cgs is out of the normal range, since a pixel charged voltage is increased or decreased in all pixels, Cgs should be compensated by controlling a level of the common voltage Vcom, and thus compensating the common voltage Vcom (S1012) is included in a process of the display device having the existing column inversion pixel structure.

Referring to FIG. 9B, in the display device having the existing Z-inversion pixel structure, an array substrate of a Z-inversion pixel structure is formed (S1020). When a capacitance Cgs is out of a normal range, first compensation pattern is formed (S1022).

As described above, when a mask is misaligned in the existing Z-inversion pixel structure, a Cgs deviation of each pixel is generated. In order to resolve this, the capacitance Cgs should be increased by adding a compensation pattern to a pixel of which the capacitance Cgs is comparatively small. The capacitance Cgs of all pixels becomes uniform through the forming of the compensation pattern (S1022).

After uniformalizing the capacitance Cgs of all pixels through the forming of the compensation pattern (S1022), since the capacitance Cgs is generally within the normal range, the capacitance Cgs is compensated by controlling a level of the common voltage Vcom (S1024).

Referring to FIGS. 9A and 9B, in the existing method, the process of compensating Cgs is necessary in a process. More specifically, in the case of the display device in which a pixel is formed in the Z-inversion method, the two kinds of steps of the forming of the compensation pattern (S1022) and the compensating of the Vcom (S1024) are necessary. In contrast, since the display device according to an embodiment does not have to compensate Cgs, such two kinds of steps may be skipped.

In addition, recently, an area in a pixel becomes narrower while a resolution of a display device increases. Therefore, an area for forming a compensation pattern which is for compensating a capacitance Cgs is being reduced. Thus, a performance of a Cgs compensation process substantially identical to that of the existing method is difficult. In this aspect, the display device according to an embodiment does not have to compensate Cgs, and thus the display device according to an embodiment can resolve the above-mentioned problems.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is not limited by the embodiments. The scope of the present invention shall be construed on the basis of the accompanying claims in such a manner that all of the technical ideas included within the scope equivalent to the claims belong to the present invention.

What is claimed is:

1. A Z-inversion type display device comprising:
a first gate line and a first data line that intersect with each other to define a pixel area on a substrate;
a first transistor that includes a gate electrode, a source electrode, and a drain electrode, wherein the drain electrode completely overlaps the first gate line in plan view; and
a pixel electrode that is in the pixel area, and is electrically connected to the drain electrode of the first transistor,
wherein the drain electrode of the first transistor has a 'T' shape comprising a horizontal leg and a vertical leg, wherein the horizontal leg of the 'T' shape drain electrode is arranged next to the source electrode and extends in parallel with the source electrode, and wherein the vertical leg of the 'T' shape drain electrode protrudes from the horizontal leg away from the source electrode,
wherein the pixel electrode is electrically connected to the drain electrode of the first transistor through a contact hole, and
wherein a width of a first portion of the first gate line corresponding to the horizontal leg is greater than a width of a second portion of the first gate line corresponding to the vertical leg.

2. The Z-inversion type display device of claim 1, wherein the contact hole completely overlaps the first gate line in plan view.

3. The Z-inversion type display device of claim 1, wherein the drain electrode of the first transistor is positioned within a margin distance from an edge of the first gate line, in plan view.

4. The Z-inversion type display device of claim 1, wherein a channel between the source electrode and the drain electrode of the first transistor completely overlaps the first gate line.

5. The Z-inversion type display device of claim 1, wherein the source electrode of the first transistor, which is a portion of the first data line or which is formed by an expansion of the portion, has an T shape.

6. The Z-inversion type display device of claim 1, wherein the pixel electrode is electrically connected to the vertical leg of the 'T' shape drain electrode through the contact hole.

7. The Z-inversion type display device of claim 1, wherein a width of a third portion of the first gate line including the contact hole is different from the width of the first portion of the first gate line corresponding to the horizontal leg of the 'T' shape drain electrode.

8. The Z-inversion type display device of claim 1, further comprising:

a second transistor comprising another drain electrode having a 'T' shape comprising another horizontal leg and another vertical leg;
a second data line next to the first data line;
wherein the first transistor and the second transistor are arranged in a region between the first data line and the second data line;
wherein the another horizontal leg of the another 'T' shape drain electrode of the second transistor is electrically coupled to the second data line.

9. The Z-inversion type display device of claim 8,
wherein the first transistor and the second transistor form a first transistor pair;
the Z-inversion type display device further comprising at least one second transistor pair of the same structure as the first transistor pair arranged in the region between the first data line and the second data line.

10. The Z-inversion type display device of claim 8,
wherein the first gate line comprises an edge in parallel to the first data line and adjacent to the horizontal leg of the drain electrode of the first transistor;
the Z-inversion type display device further comprising a second gate line in parallel to the first gate line, the second gate line comprising an edge in parallel to the second data line and adjacent to the another horizontal leg of the another drain electrode of the second transistor;
wherein the edge of the first gate line is closer to the first data line than the edge of the second gate line to the first data line.

11. The Z-inversion type display device of claim 10,
wherein a distance between the drain electrode of the first transistor and the edge of the first gate line is different from a distance between the another drain electrode of the second transistor and the edge of the second gate line.

12. The Z-inversion type display device of claim 11,
wherein an area where the drain electrode of the first transistor overlaps the first gate line is substantially same as an area where the another drain electrode of the second transistor overlaps the second gate line.

13. The Z-inversion type display device of claim 10,
wherein the source electrode of the first transistor completely overlaps the first gate line and another source electrode of the second transistor completely overlaps the second gate line in plan view.

14. The Z-inversion type display device of claim 1, wherein the contact hole completely overlaps the second portion of the first gate line and the vertical leg in plan view.

15. The Z-inversion type display device of claim 8, wherein a width of a first portion of the second gate line corresponding to the another horizontal leg is greater than a width of a second portion of the second gate line corresponding to the another vertical leg.

* * * * *